(12) United States Patent
Geng et al.

(10) Patent No.: US 11,127,639 B2
(45) Date of Patent: Sep. 21, 2021

(54) STRUCTURE AND FORMATION METHOD OF SEMICONDUCTOR DEVICE WITH FIN STRUCTURES

(71) Applicant: Taiwan Semiconductor Manufacturing Co., Ltd., Hsinchu (TW)

(72) Inventors: Zhen Geng, Hsinchu (TW); Kitchun Kwong, Hsinchu (TW); Taicheng Shieh, Hsinchu (TW); Bo-Shiuan Shie, Hsinchu (TW); Po-Nien Chen, Miaoli County (TW); Chih-Yung Lin, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/547,942

(22) Filed: Aug. 22, 2019

(65) Prior Publication Data

US 2021/0057286 A1 Feb. 25, 2021

(51) Int. Cl.
*H01L 21/8234* (2006.01)
*H01L 21/8238* (2006.01)
*H01L 27/088* (2006.01)
*H01L 27/092* (2006.01)
*H01L 27/11* (2006.01)

(52) U.S. Cl.
CPC ........ *H01L 21/823481* (2013.01); *H01L 21/823418* (2013.01); *H01L 21/823431* (2013.01); *H01L 21/823814* (2013.01); *H01L 21/823821* (2013.01); *H01L 21/823878* (2013.01); *H01L 27/0886* (2013.01); *H01L 27/0924* (2013.01); *H01L 27/1104* (2013.01); *H01L 27/1116* (2013.01)

(58) Field of Classification Search
None
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,835,262 B2 * | 9/2014 | Cai | H01L 29/66795 438/283 |

(Continued)

*Primary Examiner* — Andres Munoz
(74) *Attorney, Agent, or Firm* — Birch, Stewart, Kolasch & Birch, LLP

(57) ABSTRACT

A structure and formation method of a semiconductor device is provided. The method includes forming a first, a second, a third, and a fourth fin structures over a substrate. The method also includes forming a first spacer layer over sidewalls of the first and the second fin structures. The method further includes forming a second spacer layer over the first spacer layer and sidewalls of the third and the fourth fin structures. In addition, the method includes forming a first blocking fin between the first and the second fin structures. The first blocking fin is separated from the first fin structure by portions of the first spacer layer and the second spacer layer. The method includes forming a second blocking fin between the third and the fourth fin structures. The second blocking fin is separated from the third fin structure by a portion of the second spacer layer.

20 Claims, 18 Drawing Sheets

(56) References Cited

U.S. PATENT DOCUMENTS

| | | |
|---|---|---|
| 8,860,148 B2 | 10/2014 | Hu et al. |
| 9,105,490 B2 | 8/2015 | Wang et al. |
| 9,159,630 B1* | 10/2015 | Wei ................. H01L 21/823821 |
| 9,236,267 B2 | 1/2016 | De et al. |
| 9,236,300 B2 | 1/2016 | Liaw |
| 9,397,006 B1* | 7/2016 | Ok ...................... H01L 27/0886 |
| 9,520,482 B1 | 12/2016 | Chang et al. |
| 9,576,814 B2 | 2/2017 | Wu et al. |
| 9,748,245 B1* | 8/2017 | Cheng ................. H01L 29/6681 |
| 10,002,923 B2* | 6/2018 | Cheng ................. H01L 27/1211 |
| 10,043,900 B1* | 8/2018 | Bi ......................... H01L 29/785 |
| 10,121,880 B2* | 11/2018 | Mao ...................... H01L 21/324 |
| 10,163,635 B1* | 12/2018 | Qi ........................ H01L 27/0886 |
| 10,896,957 B2* | 1/2021 | Cho .................. H01L 21/02576 |
| 2007/0111448 A1* | 5/2007 | Li ..................... H01L 29/66795 |
| | | 438/264 |
| 2010/0197096 A1* | 8/2010 | Johnson .......... H01L 21/823431 |
| | | 438/268 |
| 2014/0367795 A1* | 12/2014 | Cai ..................... H01L 27/0886 |
| | | 257/392 |
| 2016/0056156 A1* | 2/2016 | Ghani ................. H01L 21/2255 |
| | | 257/401 |
| 2016/0079248 A1* | 3/2016 | Basker .............. H01L 27/10879 |
| | | 257/347 |
| 2017/0053825 A1* | 2/2017 | Seo ..................... H01L 27/0924 |
| 2017/0069630 A1* | 3/2017 | Cha ................. H01L 21/823821 |
| 2018/0047613 A1* | 2/2018 | Zhou ................. H01L 29/66787 |

* cited by examiner

STRUCTURE AND FORMATION METHOD OF SEMICONDUCTOR DEVICE WITH FIN STRUCTURES

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
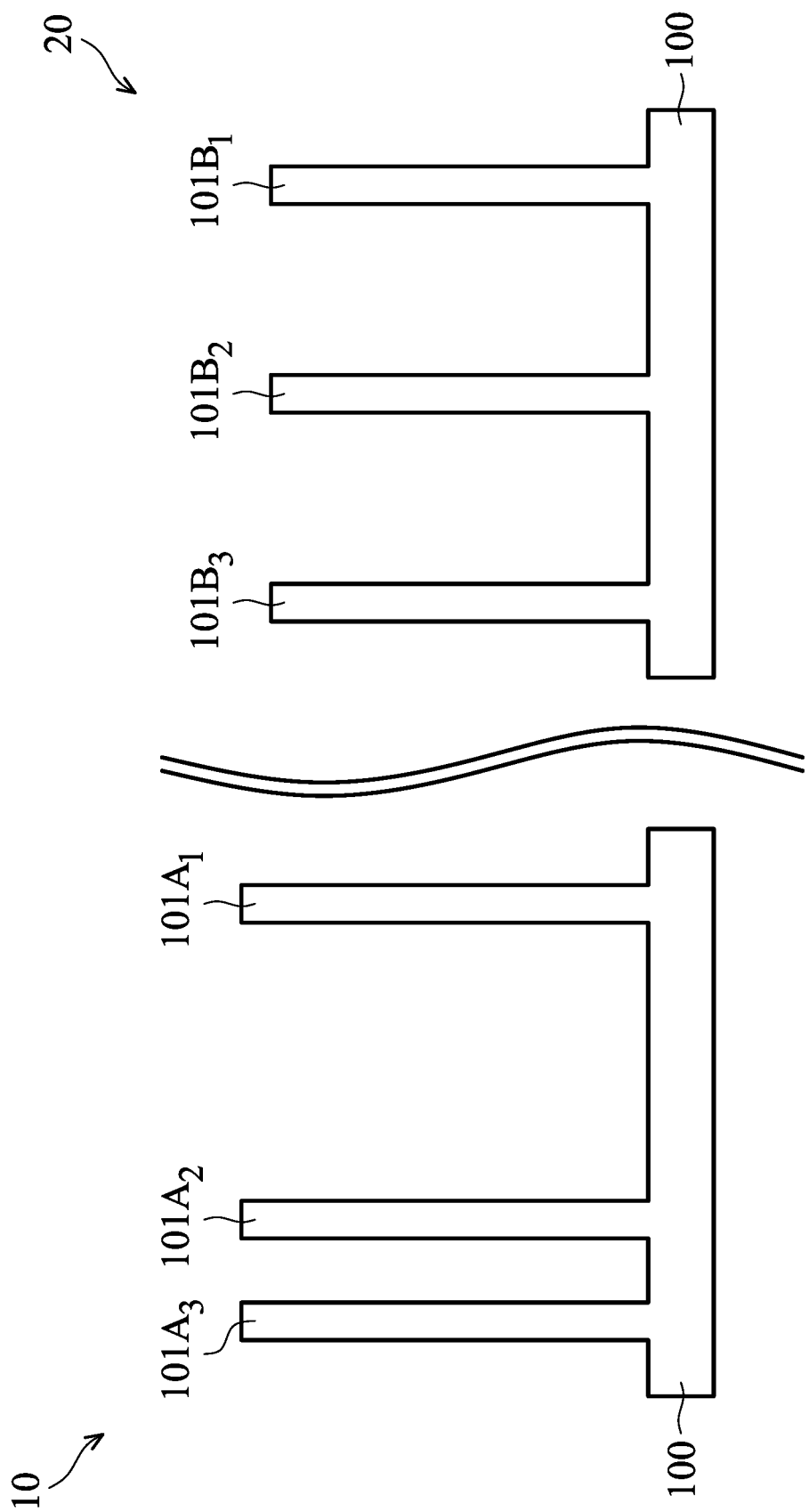
FIGS. 1A-1I are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Embodiments of the disclosure may relate to FinFET structure having fins. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1I are cross-sectional views of various stages of a process for forming a semiconductor device structure, in accordance with some embodiments. As shown in FIG. 1A, a semiconductor substrate 100 is received or provided. The semiconductor substrate 100 includes regions 10 and 20. In some embodiments, the region 10 is designed for forming logic devices. In some embodiments, input/output (IO) devices are to be formed over the region 10. In some embodiments, the region 20 is designed for forming memory devices. In some embodiments, static random access memory (SRAM) devices are to be formed over the region 20.

In some embodiments, the semiconductor substrate 100 is a bulk semiconductor substrate, such as a semiconductor wafer. For example, the semiconductor substrate 100 includes silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 1A, multiple fin structures $101A_1$ to $101A_3$ are formed over the region 10, and multiple fin structures $101B_1$ to $101B_3$ are formed over the region 20, in accordance with some embodiments. In some embodiments, the distance between the fin structures $101A_1$ and $101A_2$ is longer than the distance between the fin structures $101A_2$ and $101A_3$. In some embodiments, the distance between the fin structures $101B_1$ and $101B_2$ is substantially equal to the distance between the fin structures $101B_2$ and $101B_3$.

In some embodiments, multiple recesses (or trenches) are formed in the semiconductor substrate 100, in accordance with some embodiments. As a result, multiple fin structures that protrude from the surface of the semiconductor substrate 100 are formed or defined between the recesses. In some embodiments, one or more photolithography and etching processes are used to form the recesses. In some embodiments, the fin structures $101A_1$-$101A_3$ and $101B_1$-$101B_3$ are in direct contact with the semiconductor substrate 100.

However, embodiments of the disclosure have many variations and/or modifications. In some other embodiments, the fin structures $101A_1$-$101A_3$ and $101B_1$-$101B_3$ are not in direct contact with the semiconductor substrate 100. One or more other material layers may be formed between the semiconductor substrate 100 and the fin structures $101A_1$-$101A_3$ and $101B_1$-$101B_3$. For example, a dielectric layer may be formed therebetween.

Figure 1B:
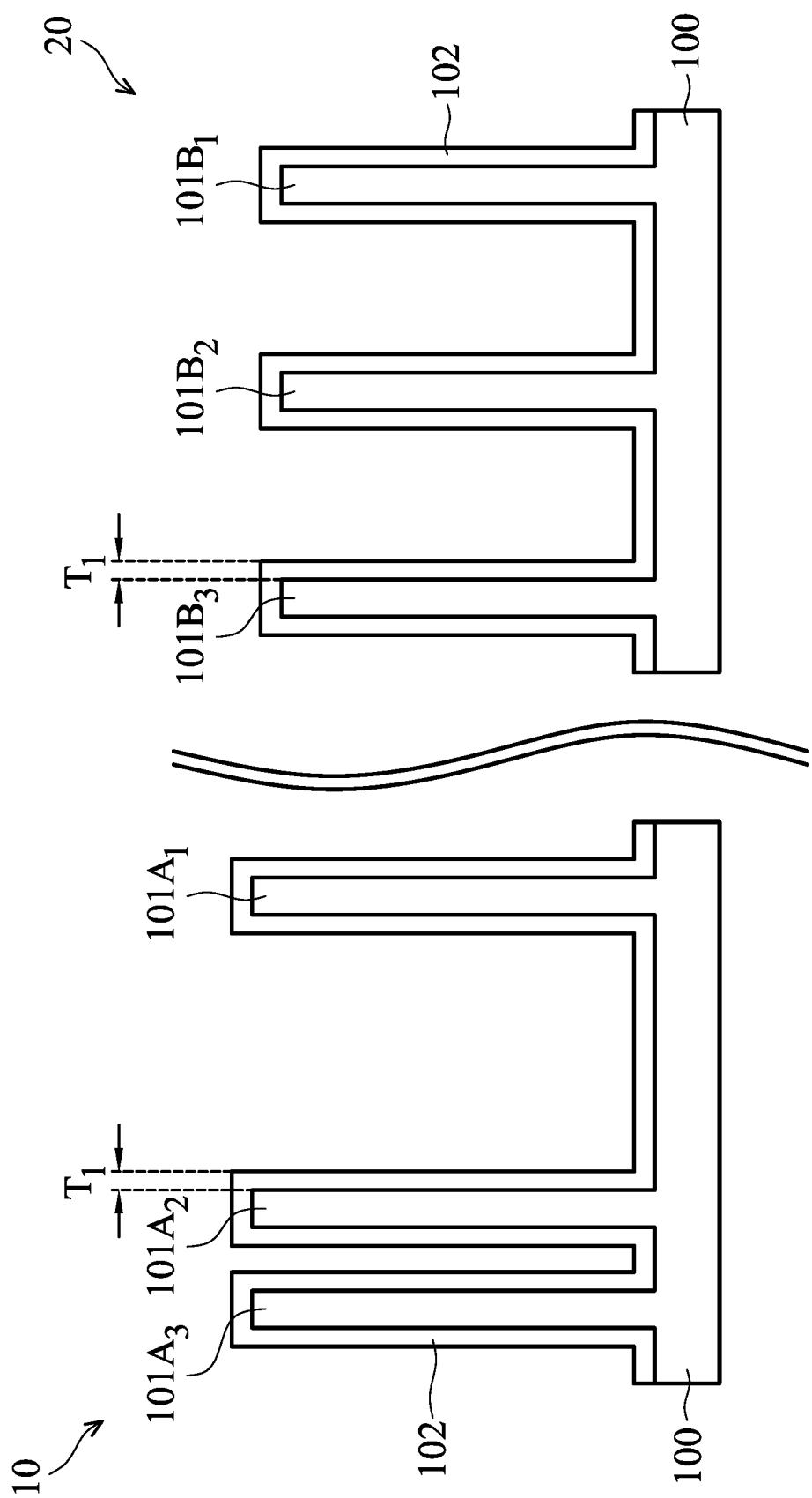

As shown in FIG. 1B, a spacer layer 102 is deposited over the semiconductor substrate 100 and the fin structures $101A_1$-$101A_3$ and $101B_1$-$101B_3$, in accordance with some embodiments. In some embodiments, the spacer layer 102 extends along sidewalls of the fin structures $101A_1$-$101A_3$ and $101B_1$-$101B_3$. In some embodiments, the spacer layer 102 conformally extends along the fin structures $101A_1$-$101A_3$ and $101B_1$-$101B_3$. In some embodiments, the spacer layer 102 is in direct contact with the fin structures $101A_1$-$101A_3$ and $101B_1$-$101B_3$. As shown in FIG. 1B, the spacer layer 102 may have a thickness $T_1$. The thickness $T_1$ may be in a range from about 3 nm to about 6 nm. (Note to Inventor: Please confirm or modify suitable T1 range.)

In some embodiments, the spacer layer 102 is made of or includes a dielectric material. The dielectric material may include silicon oxide, silicon carbide, silicon oxynitride, silicon nitride, one or more other suitable materials, or a combination thereof. The spacer layer 102 may be deposited using a chemical vapor deposition (CVD) process, an atomic layer deposition (ALD) process, a thermal oxidation process, a physical vapor deposition (PVD) process, one or more other applicable processes, or a combination thereof.

Figure 1C:
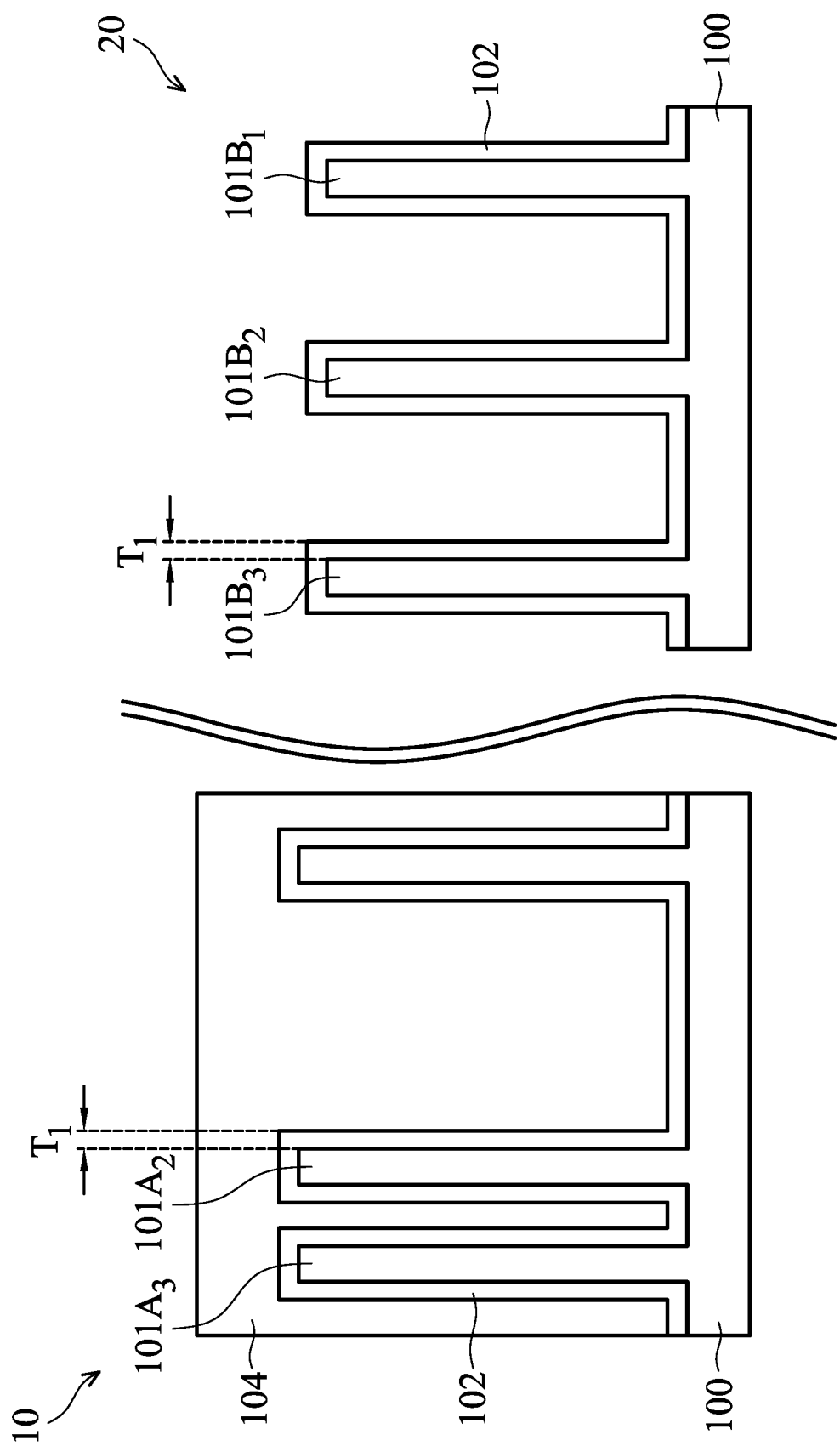

As shown in FIG. 1C, a mask element 104 is formed to cover the fin structures $101A_1$-$101A_3$ and the portion of the spacer layer 102 that is over the fin structures $101A_1$-$101A_3$, in accordance with some embodiments. The portion of the spacer layer 102 that is over the fin structures $101B_1$-$101B_3$ are exposed without being covered by the mask element 104. In some embodiments, the mask element 104 is made of or includes a photoresist material. The formation of the mask element 104 may involve a photolithography process. The mask element 104 may function as an etching mask during a subsequent etching process for partial removal of the spacer layer 102.

Figure 1D:
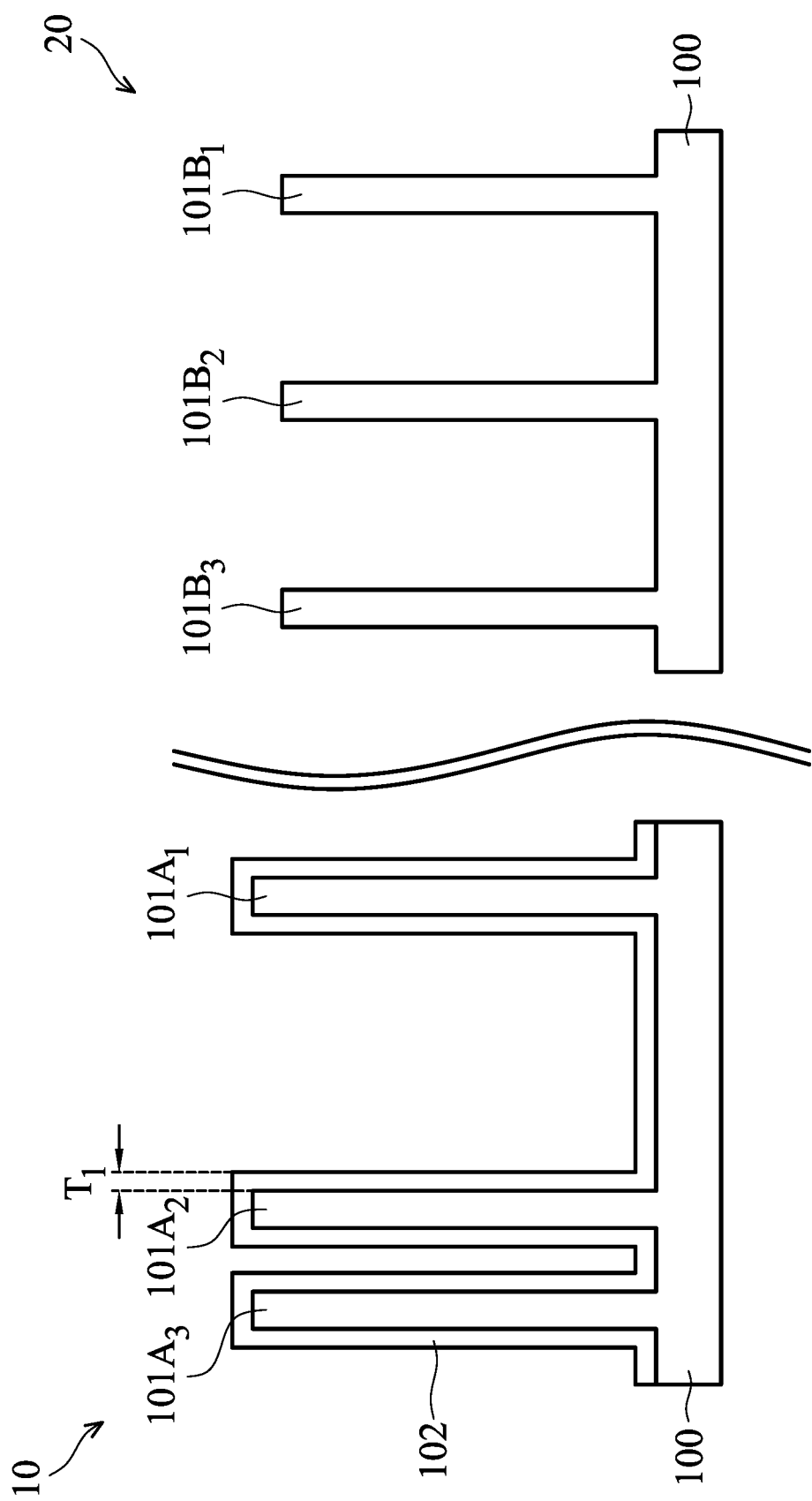

As shown in FIG. 1D, the portion of the spacer layer 102 that is not covered by the mask element 104 and is over the fin structures $101B_1$-$101B_3$ is removed, in accordance with some embodiments. An etching process may be used to partially remove the spacer layer 102. Afterwards, the mask element 104 is removed, as shown in FIG. 1D. After the etching process, the spacer layer 102 extends along the sidewalls of the fin structures $101A_1$-$101A_3$ without extending along the sidewalls of the fin structures $101B_1$-$101B_3$.

Figure 1E:
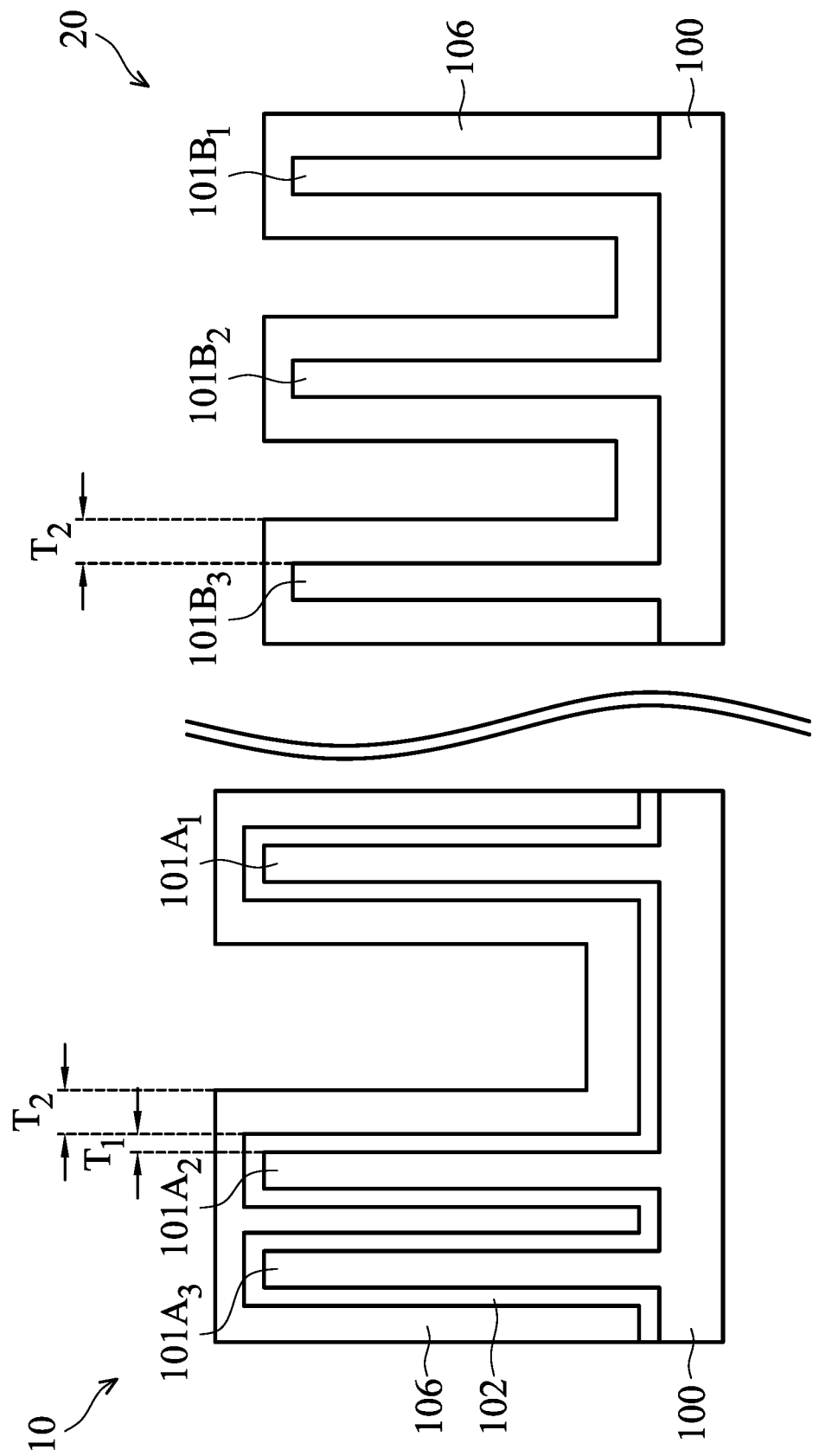

As shown in FIG. 1E, a spacer layer 106 is deposited over the spacer layer 102 and the fin structures $101B_1$-$101B_3$, in accordance with some embodiments. In some embodiments, the spacer layer 106 extends along sidewalls of the fin structures $101A_1$-$101A_3$ and $101B_1$-$101B_3$. In some embodiments, the spacer layer 106 conformally extends along the fin structures $101A_1$-$101A_3$ and $101B_1$-$101B_3$. In some embodiments, the spacer layer 106 completely fills the recess (or the trench) between the fin structures $101A_2$ and $101A_3$, as shown in FIG. 1E. In some embodiments, a portion of the spacer layer 102 is between a portion of the spacer layer 106 and the fin structure $101A_1$, $101A_2$, or $101A_3$.

In some embodiments, the spacer layer 106 is in direct contact with the fin structures $101B_1$-$101B_3$. In some embodiments, the spacer layer 106 is in direct contact with the spacer layer 102. As shown in FIG. 1E, the spacer layer 106 may have a thickness $T_2$. In some embodiments, the spacer layer 106 is thicker than the spacer layer 102. The thickness $T_2$ is greater than the thickness $T_1$. The thickness $T_2$ may be in a range from about 10 nm to about 15 nm. (Note to Inventor: Please confirm or modify suitable T2 range.)

In some embodiments, the spacer layer 106 is made of or includes a dielectric material. The dielectric material may include silicon oxide, silicon carbide, silicon oxynitride, silicon nitride, one or more other suitable materials, or a combination thereof. In some embodiments, the spacer layers 106 and 102 are made of the same material. In some embodiments, since the spacer layers 106 and 102 are deposited at different processing stages, the interface between the spacer layers 106 and 102 is observable even if they are made of the same material. For example, an electron microscope may be used to observe the interface between the spacer layers 106 and 102.

However, embodiments of the disclosure are not limited thereto. Many variations and/or modifications can be made to embodiments of the disclosure. In some other embodiments, the spacer layers 106 and 102 are made of different materials.

The spacer layers 106 and 102 may be deposited using the same kind of process. The spacer layer 106 may be deposited using a chemical vapor deposition (CVD) process, an atomic layer deposition (ALD) process, a thermal oxidation process, a physical vapor deposition (PVD) process, one or more other applicable processes, or a combination thereof.

Figure 1F:
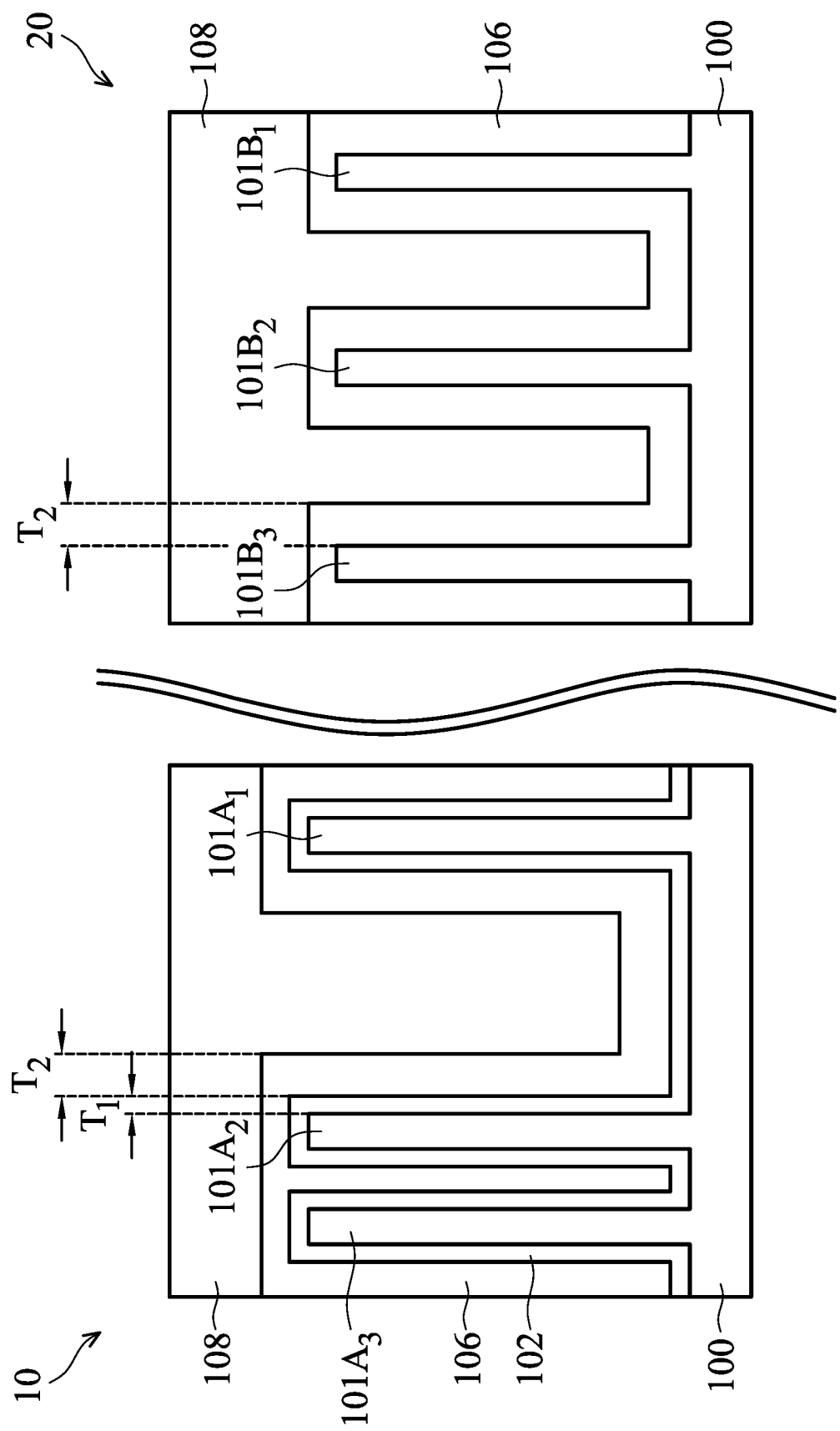

As shown in FIG. 1F, an insulating layer 108 is deposited over the spacer layer 106, in accordance with some embodiments. In some embodiments, the insulating layer 108 fills the recesses (or the trenches) between the fin structures, as shown in FIG. 1F. In some embodiments, the insulating layer 108 is made of a material that is different than the material of the spacer layer 106 or 102.

The insulating layer 108 may be made of or include nitride (such as silicon nitride, silicon carbon nitride, silicon oxycarbon nitride, titanium nitride, or tantalum nitride), carbide (such as silicon oxycarbide), metal oxide (such as oxides of Li, Be, Mg, Ca, Sr, Sc, Y, Zr, Al, La, Ce, Pr, Nd, Sm, Eu, Gd, Tb, Dy, Ho, Hf, Er, Tm, Yb, Lu, and/or mixtures thereof), oxide (such as silicon oxide), one or more other suitable materials, or a combination thereof.

The insulating layer 108 may be deposited using a flowable chemical vapor deposition (FCVD) process, a CVD process, an ALD process, a spin coating process, one or more other applicable processes, or a combination thereof.

Figure 1G:
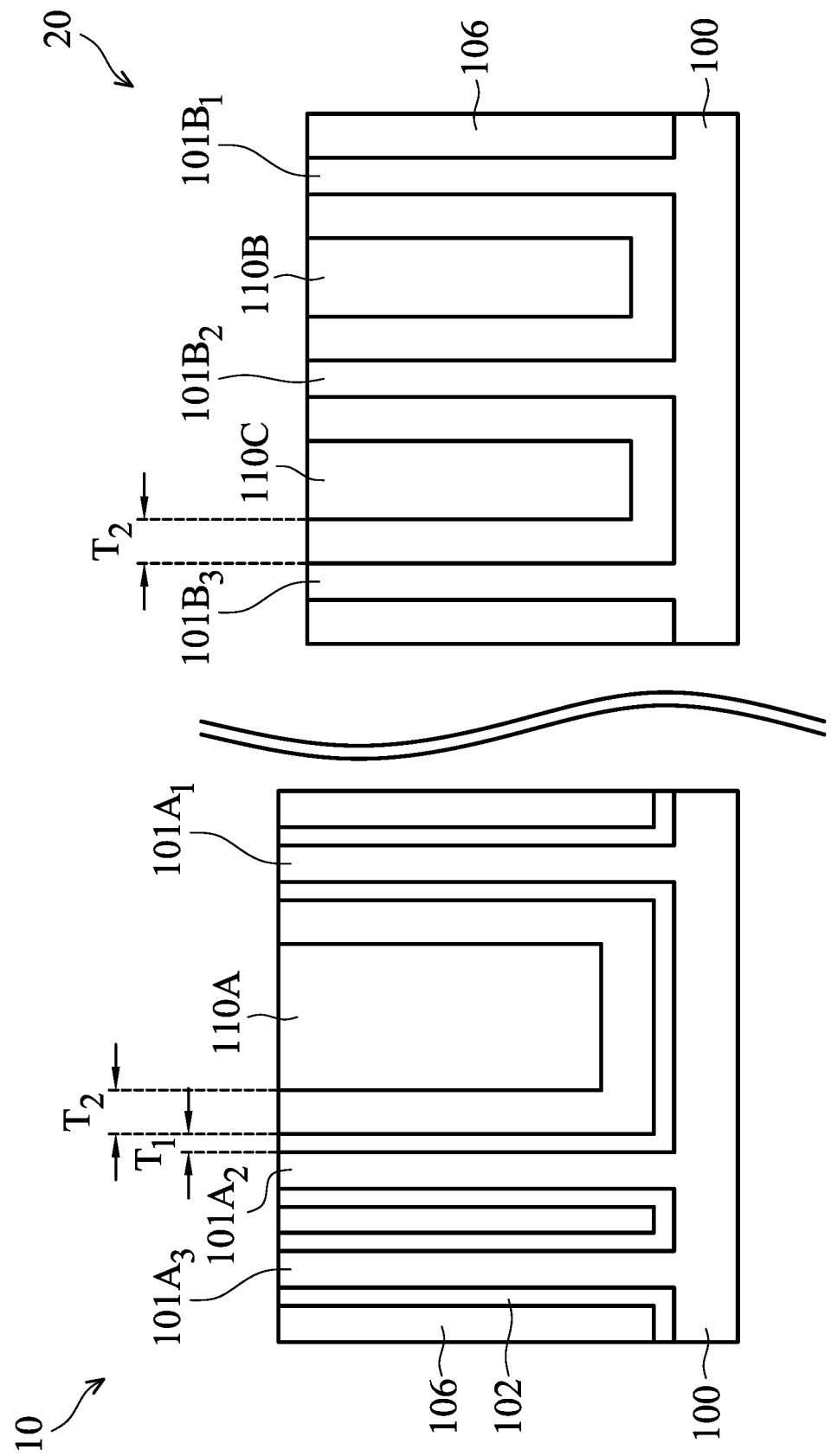

As shown in FIG. 1G, the insulating layer 108 is planarized to expose the fin structures $101A_1$-$101A_3$ and $101B_1$-$101B_3$, in accordance with some embodiments. A portion of the insulating layer 108 remaining in the recess (or the trench) between the fin structures $101A_1$ and $101A_2$ forms a blocking fin 110A. A portion of the insulating layer 108 remaining in the recess (or the trench) between the fin structures $101B_1$ and $101B_2$ forms a blocking fin 110B. A portion of the insulating layer 108 remaining in the recess (or the trench) between the fin structures $101B_2$ and $101B_3$ forms a blocking fin 110C.

Figure 1H:
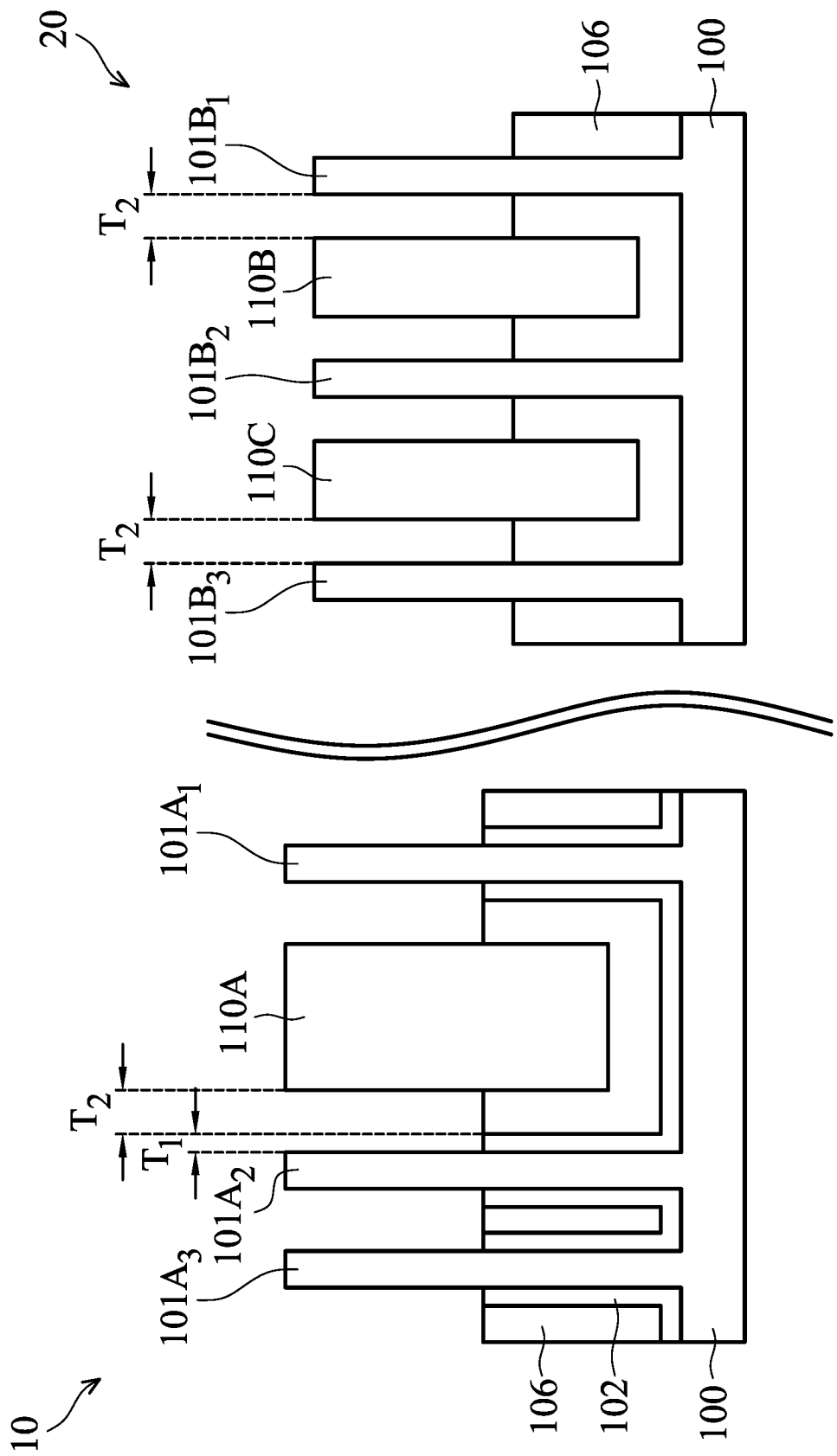

As shown in FIG. 1H, the spacer layers 102 and 106 are partially removed to expose upper portions of the fin structures $101A_1$-$101A_3$ and $101B_1$-$101B_3$, in accordance with some embodiments. In some embodiments, upper portions of the blocking fins 110A, 110B, and 110C are also exposed. In some embodiments, the spacer layers 102 and 106 are partially removed using an etching process. In some embodiments, since the material of the blocking fins 110A, 110B, and 110C is different than that of the spacer layers 102 and 106, the blocking fins 110A, 110B, and 110C are substantially prevented from being etched during the etching process.

As shown in FIG. 1H, the fin structure $101B_1$ is laterally departed from the blocking fin 110B by a distance that is equal to the thickness $T_2$ of the spacer layer 106. Similarly, the fin structure $101B_3$ is laterally departed from the blocking fin 110C by a distance that is equal to the thickness $T_2$ of the spacer layer 106.

Unlike the region 20, the blocking fin and the fin structures formed over the region 10 are separated from each other by a longer distance. Due to the spacer layer 102, the fin structure $101B_1$ is laterally departed from the blocking fin 110B by a longer distance $(T_1+T_2)$ that is equal to the sum of the thickness $T_2$ of the spacer layer 106 and the thickness $T_1$ of the spacer layer 102.

Due to the additional spacer layer (i.e., the spacer layer 102), a wider space is provided between the fin structure ($101A_1$ or $101A_2$) and the blocking fin 110A, which facilitates the subsequent processes. In some embodiments, an IO device is designed to be formed over the region 10. The wider space allows the risk of I/O device breakdown to be significantly reduced. A greater breakdown voltage (VBD) of the I/O device may be obtained due to the wider space between the fin structure and the blocking fin. The wider space may ensure a subsequent gate replacement process to be well-performed. The residue issue may be prevented since a wider space is provided. The performance and reliability of the device formed over the region 10 are greatly improved.

Figure 1I:
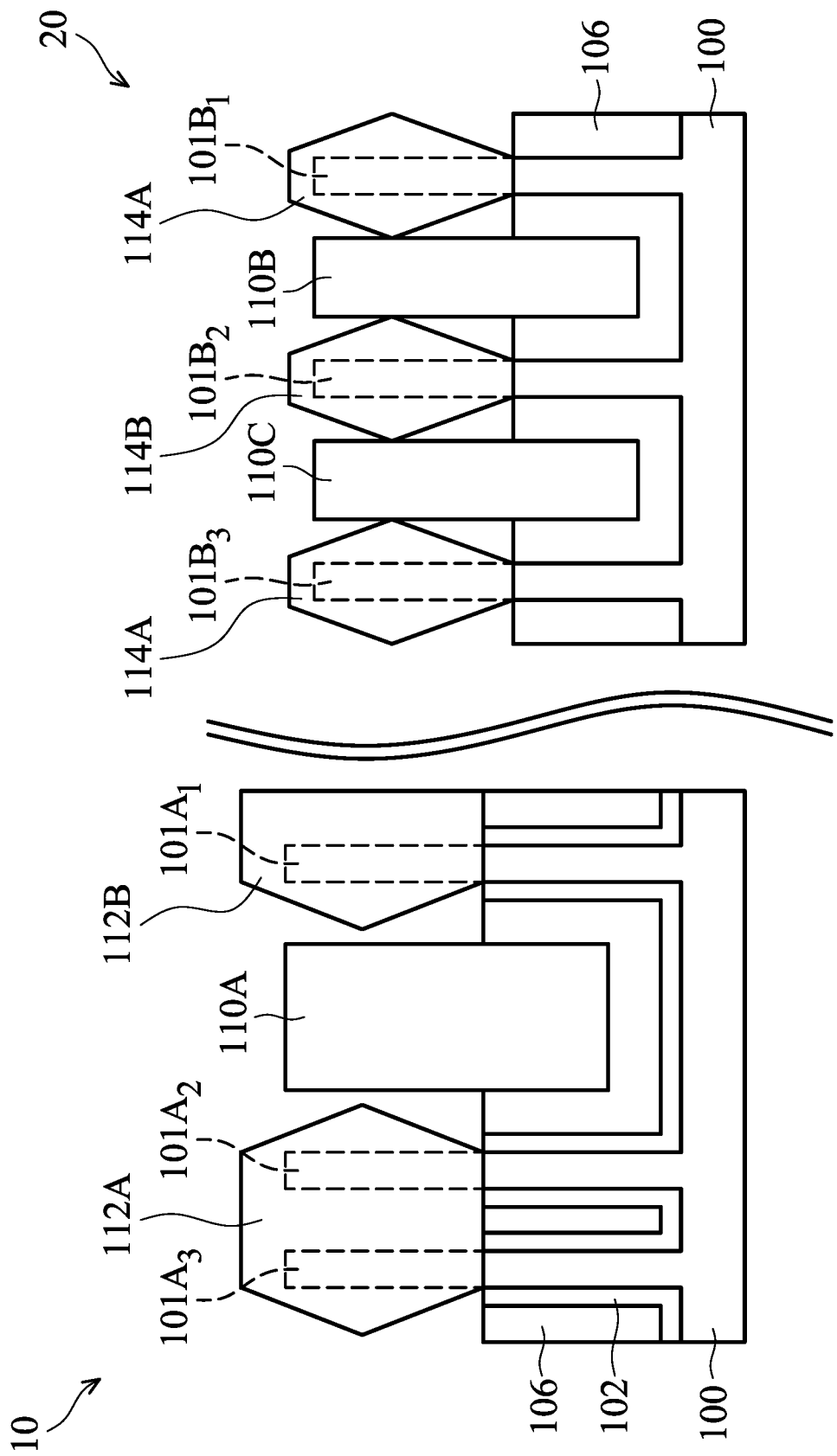

Afterwards, dummy gate stacks (not shown) are formed to wrap around portions of the fin structures $101A_1$-$101A_3$ and $101B_1$-$101B_3$. Afterwards, epitaxial structures 112A, 112B, 114A, and 114B are formed, as shown in FIG. 1I in accordance with some embodiments. In some embodiments, the epitaxial structures 112A, 112B, 114A, and 114B are formed to surround the fin structures $101A_1$-$101A_3$ and $101B_1$-$101B_3$. In some other embodiments, the portions of the fin structures $101A_1$-$101A_3$ and $101B_1$-$101B_3$ that are not covered by the dummy gate stacks are recessed before the formation of the epitaxial structures 112A, 112B, 114A, and 114B. In these cases, the epitaxial structures may be grown on the recessed fin structures.

In some embodiments, each of the epitaxial structures 112A and 112B is a merged epitaxial structure that extends across multiple fin structures. For example, the epitaxial structure 112A is grown from the fin structures (or the recessed fin structures) $101A_2$ and $101A_3$ and extends across the fin structures (or the recessed fin structures) $101A_2$ and $101A_3$. In some embodiments, the epitaxial structures 112A and 112B are p-type semiconductor structures. For example, the epitaxial structures 112A and 112B may include epitaxially grown silicon germanium or silicon germanium doped with boron. It should be appreciated, however, that the epitaxial structures 112A and 112B are not limited to being p-type semiconductor structures.

In some embodiments, the epitaxial structures 112A and 112B are n-type semiconductor structures. The epitaxial structures 112A and 112B may include epitaxially grown silicon, epitaxially grown silicon carbide (SiC), epitaxially grown silicon phosphide (SiP), or another suitable epitaxially grown semiconductor material. Alternatively, one of the epitaxial structures 112A and 112B is a p-type semiconductor structure while another one is a n-type semiconductor structure.

In some embodiments, the epitaxial structures 112A and 112B are formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, one or more other applicable processes, or a combination thereof.

In some embodiments, one or both of the epitaxial structures 112A and 112B are doped with one or more suitable dopants. For example, the epitaxial structures 112A and 112B are SiGe source/drain features doped with boron (B), indium (In), or another suitable dopant. Alternatively, in some other embodiments, one or both of the epitaxial structures 112A and 112B are Si source/drain features doped with phosphor (P), antimony (Sb), or another suitable dopant.

In some embodiments, the epitaxial structures 112A and 112B are doped in-situ during their epitaxial growth. In some other embodiments, the epitaxial structures 112A and 112B are not doped during the growth of the epitaxial structures 112A and 112B. Instead, after the formation of the epitaxial structures 112A and 112B, the epitaxial structures 112A and 112B are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 112A and 112B are further exposed to one or more annealing processes to activate the dopants. For example, a rapid thermal annealing process is used.

In some embodiments, each of the epitaxial structures 114A and 114B is a single epitaxial structure over a single fin structure. For example, the epitaxial structure 112B is grown from the fin structure (or the recessed fin structure) $101B_2$. In some other embodiments, the epitaxial structures 114A and 114B are semiconductor structures with different conductivity types. In some embodiments, the epitaxial structure 114B is an n-type semiconductor structure, and the epitaxial structures 114A are p-type semiconductor structure. In some other embodiments, the epitaxial structure 114B is a p-type semiconductor structure, and the epitaxial structures 114A are n-type semiconductor structure.

In some embodiments, the epitaxial structures 114A and 114B are separately grown using separate epitaxial growth processes. The epitaxial growth process of the epitaxial structures 114A and/or 114B may be the same as or similar to those used for forming the epitaxial structures 112A and/or 112B. In some embodiments, a first mask element is used to cover the fin structure $101B_2$ while the epitaxial structures 114A are grown on the fin structures $101B_1$ and $101B_3$. Afterwards, the first mask element is removed, and a second mask element is formed to cover the epitaxial structures 114A. Then, the epitaxial structure 114B is grown on the fin structure $101B_2$. Afterwards, the second mask element is removed, and the structure shown in FIG. 1I is obtained.

The blocking fins 110A and 110B may be used to prevent the neighboring epitaxial structures 114A and 114B from being merged together. In some embodiments, the epitaxial structure 114A and 114B are separated from each other by the blocking fin 110A. In some embodiments, the blocking fin 110A or 110B is in direct contact with one of or both of the epitaxial structures 114A and 114B.

Afterwards, a dielectric layer is deposited, followed by gate replacement processes. Due to the additional spacer layer (i.e., the spacer layer 102), a wider space is provided between the fin structure ($101A_1$ or $101A_2$) and the blocking fin 110A, which facilitates the gate replacement processes. The wider space may ensure the gate replacement processes to be well-performed. The residue issue may be prevented since a wider space is provided. The performance and reliability of the device formed over the region 10 are greatly improved. For example, the breakdown risk of the devices formed on the region 10 is significantly reduced.

Many variations and/or modifications can be made to embodiments of the disclosure. FIGS. 2A-2I are cross-sectional views of various stages of a process for forming a semiconductor device structure, in accordance with some embodiments.

Figure 2A:
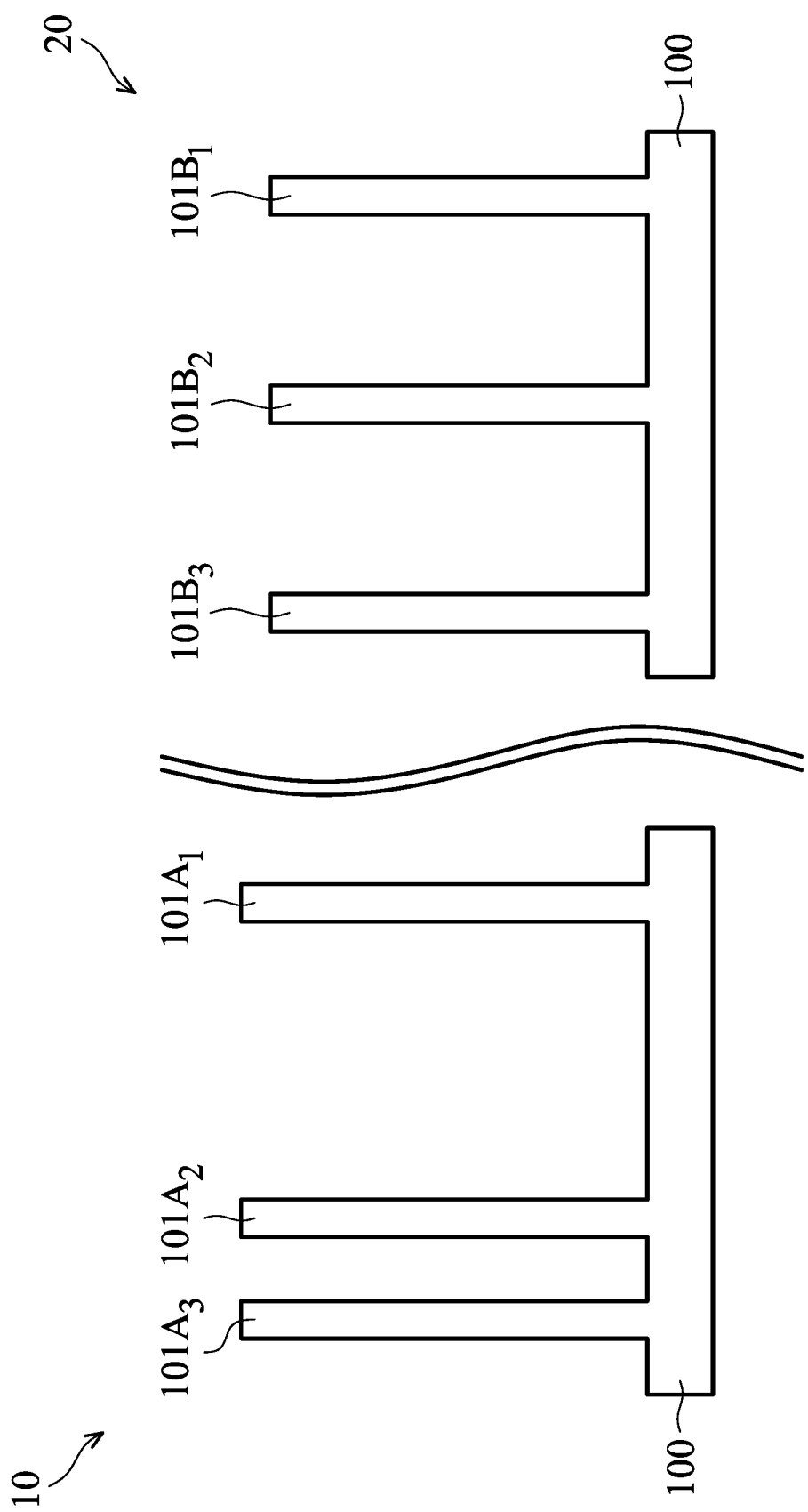
FIGS. 2A-2I are cross-sectional views of various stages of a process for forming a semiconductor device structure, in accordance with some embodiments.
Figure 2B:
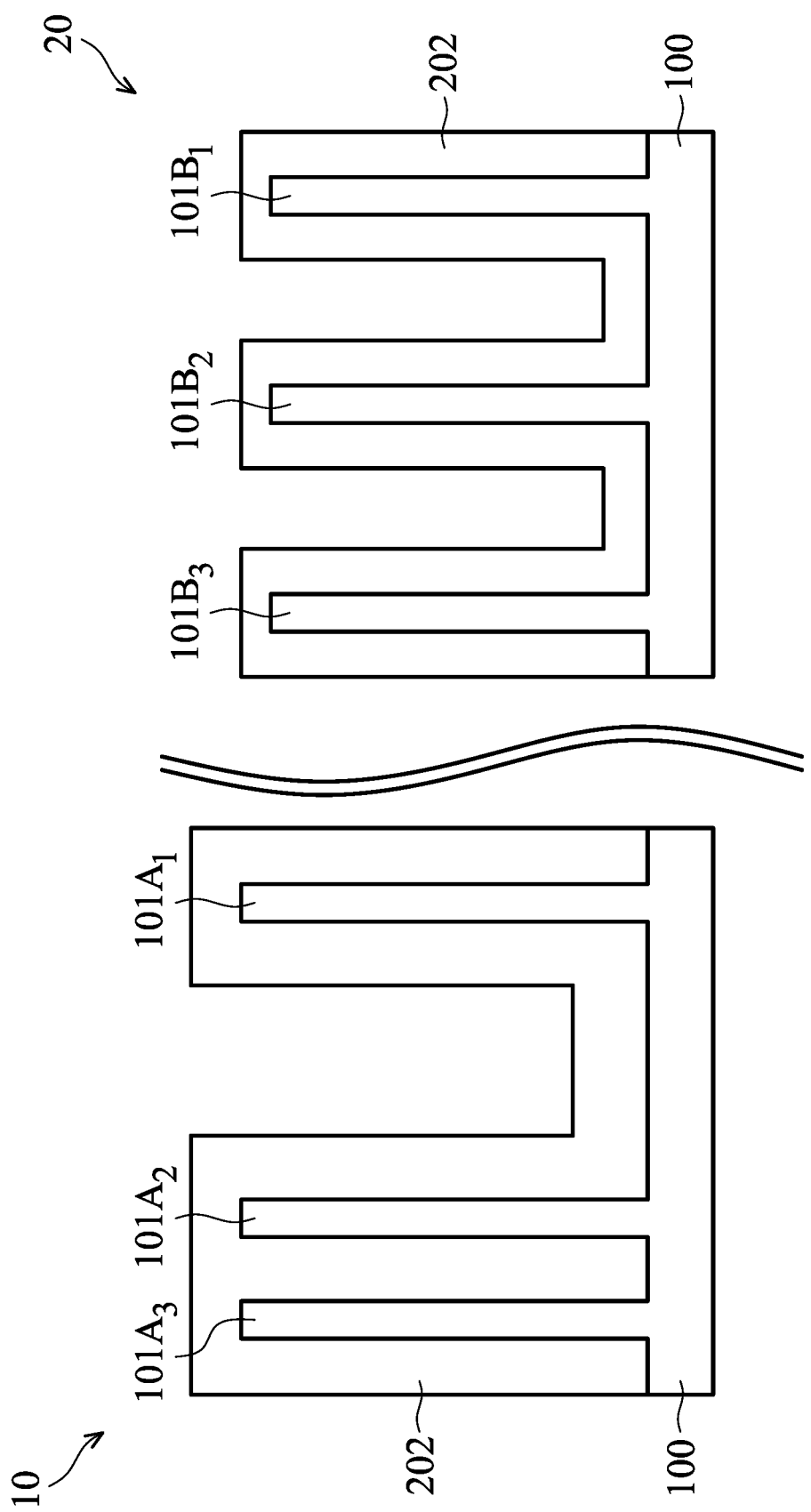

As shown in FIG. 2A, a structure that is the same as or similar to the structure shown in FIG. 1A is received or provided. Afterwards, a spacer layer 202 is deposited over the semiconductor substrate 100 and the fin structures $101A_1$-$101A_3$ and $101B_1$-$101B_3$, as shown in FIG. 2B in accordance with some embodiments.

In some embodiments, the spacer layer 202 extends along sidewalls of the fin structures $101A_1$-$101A_3$ and $101B_1$-$101B_3$. In some embodiments, the spacer layer 202 conformally extends along the fin structures $101A_1$-$101A_3$ and $101B_1$-$101B_3$. In some embodiments, the spacer layer 202 is in direct contact with the fin structures $101A_1$-$101A_3$ and $101B_1$-$101B_3$. In some embodiments, the spacer layer 202 fills the recess (or the trench) between the fin structures $101A_2$ and $101A_3$. In some embodiments, the thickness of the spacer layer 202 may be the same as or similar to the thickness $T_2$ of the spacer layer 106 shown in FIG. 1E. The material and formation method of the spacer layer 202 may be the same as or similar to those of the spacer layer 106 shown in FIG. 1E.

Figure 2C:
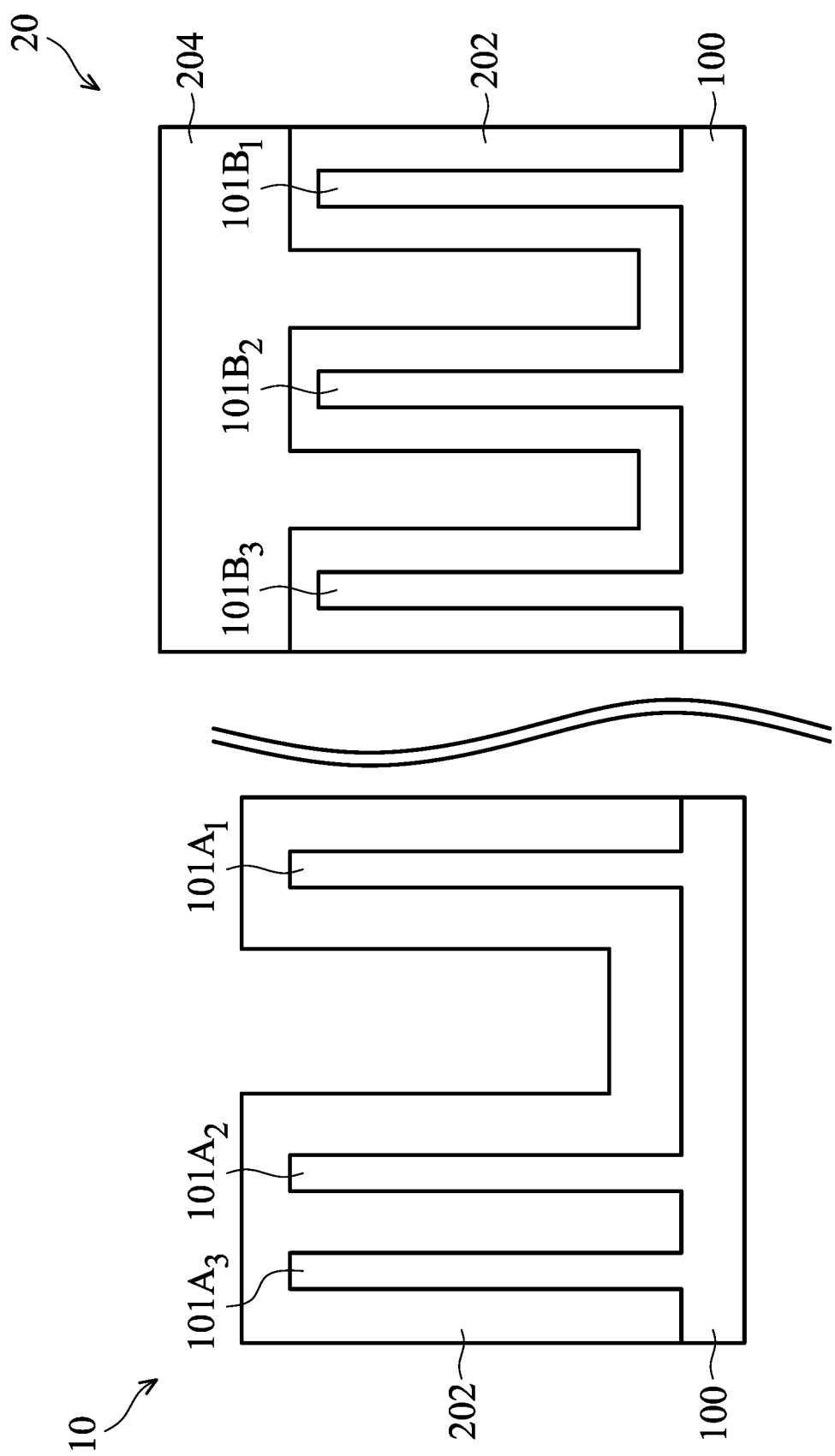

As shown in FIG. 2C, a mask element 204 is formed to cover the fin structures $101B_1$-$101B_3$ and the portion of the spacer layer 202 that is over the fin structures $101B_1$-$101B_3$, in accordance with some embodiments. The portion of the spacer layer 202 that is over the fin structures $101A_1$-$101A_3$ are exposed without being covered by the mask element 204. In some embodiments, the mask element 204 is made of or includes a photoresist material. The formation of the mask element 204 may involve a photolithography process.

Figure 2D:
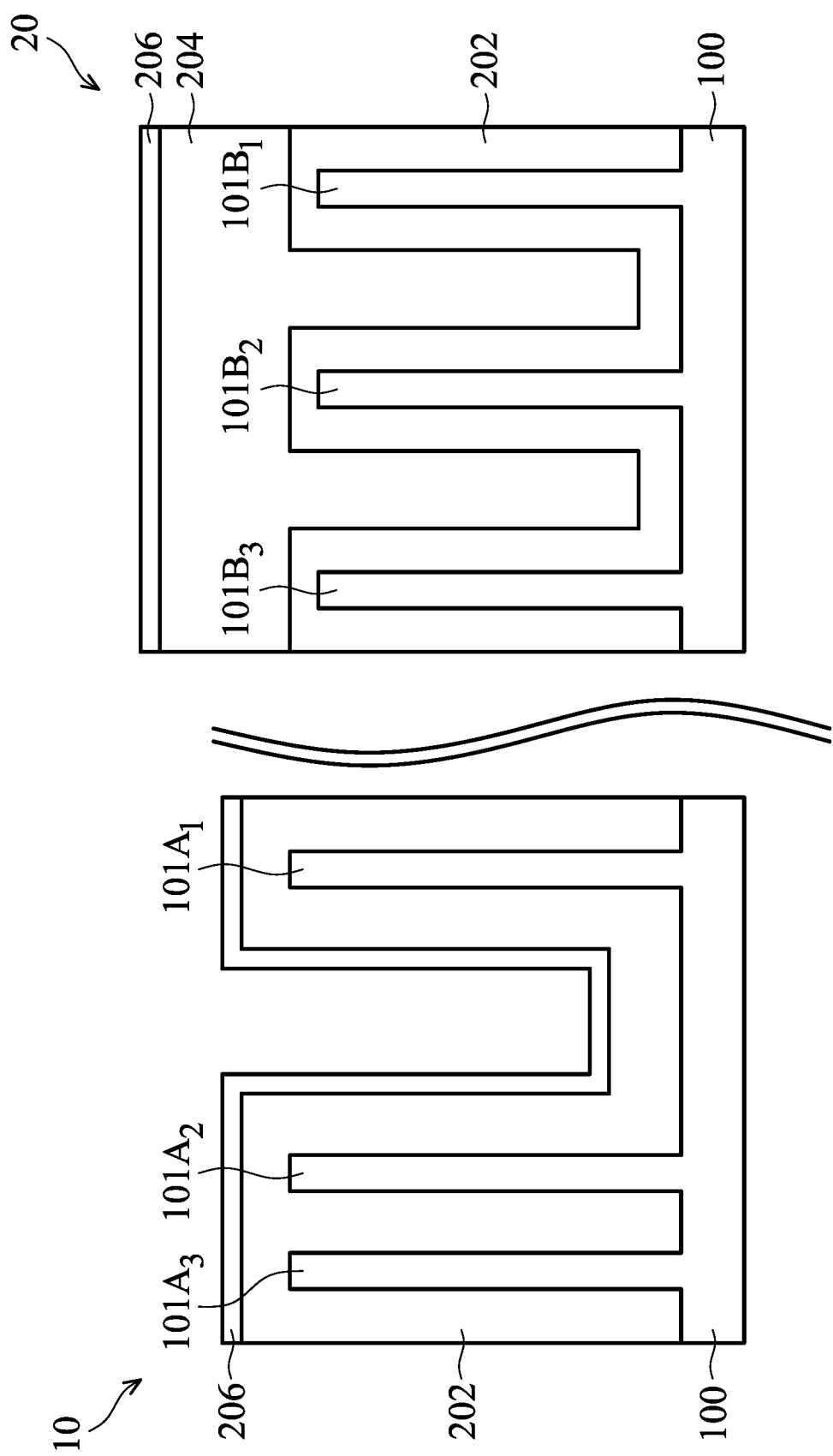

As shown in FIG. 2D, a spacer layer 206 is deposited over the portion of the spacer layer 202 that is not covered by the mask element 204, in accordance with some embodiments. The spacer layer 206 may also extend over the mask element 204. In some embodiments, the spacer layer 206 extends along sidewalls of the fin structures $101A_1$ and $101A_2$. In some embodiments, the spacer layer 206 conformally extends along the fin structures $101A_1$ and $101A_2$. In some embodiments, the spacer layer 102 does not extend along the sidewalls of the fin structures $101B_1$-$101B_3$ due to the blocking of the mask element 204. In some embodiments, a portion of the spacer layer 202 is between a portion of the spacer layer 206 and the fin structure $101A_1$ or $101A_2$.

In some embodiments, the spacer layer 206 is in direct contact with the spacer layer 202. In some embodiments, the spacer layer 206 may have a thickness that is the same as or similar to the thickness $T_1$ of the spacer layer 102 shown in FIG. 1B. In some embodiments, the spacer layer 206 is thinner than the spacer layer 202.

In some embodiments, the spacer layer 206 is made of or includes a dielectric material. The dielectric material may include silicon oxide, silicon carbide, silicon oxynitride, silicon nitride, one or more other suitable materials, or a combination thereof. In some embodiments, the spacer layers 206 and 202 are made of the same material. In some embodiments, since the spacer layers 206 and 202 are deposited at different processing stages, the interface between the spacer layers 206 and 202 is observable even if they are made of the same material. For example, the electron microscope may be used to observe the interface between the spacer layers 206 and 202.

However, embodiments of the disclosure are not limited thereto. Many variations and/or modifications can be made to embodiments of the disclosure. In some other embodiments, the spacer layers 206 and 202 are made of different materials.

The spacer layers 206 and 202 may be deposited using the same kind of process. The spacer layer 206 may be deposited using a chemical vapor deposition (CVD) process, an atomic layer deposition (ALD) process, a thermal oxidation process, a physical vapor deposition (PVD) process, one or more other applicable processes, or a combination thereof.

Figure 2E:
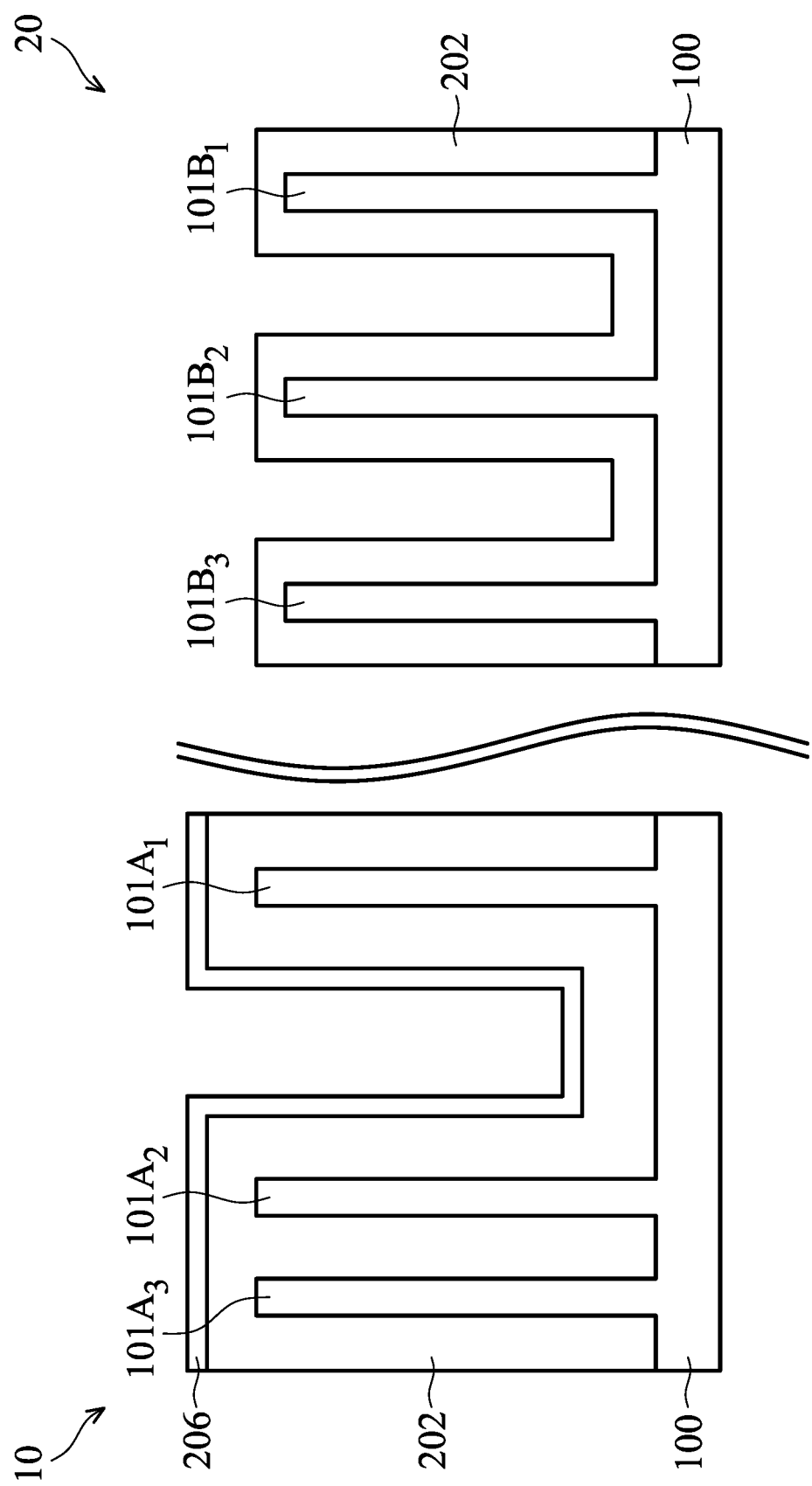

As shown in FIG. 2E, the mask element 204 is removed, in accordance with some embodiments. The portion of the spacer layer 206 over the mask element 204 is also removed together with the removal of the mask element 204.

Figure 2F:
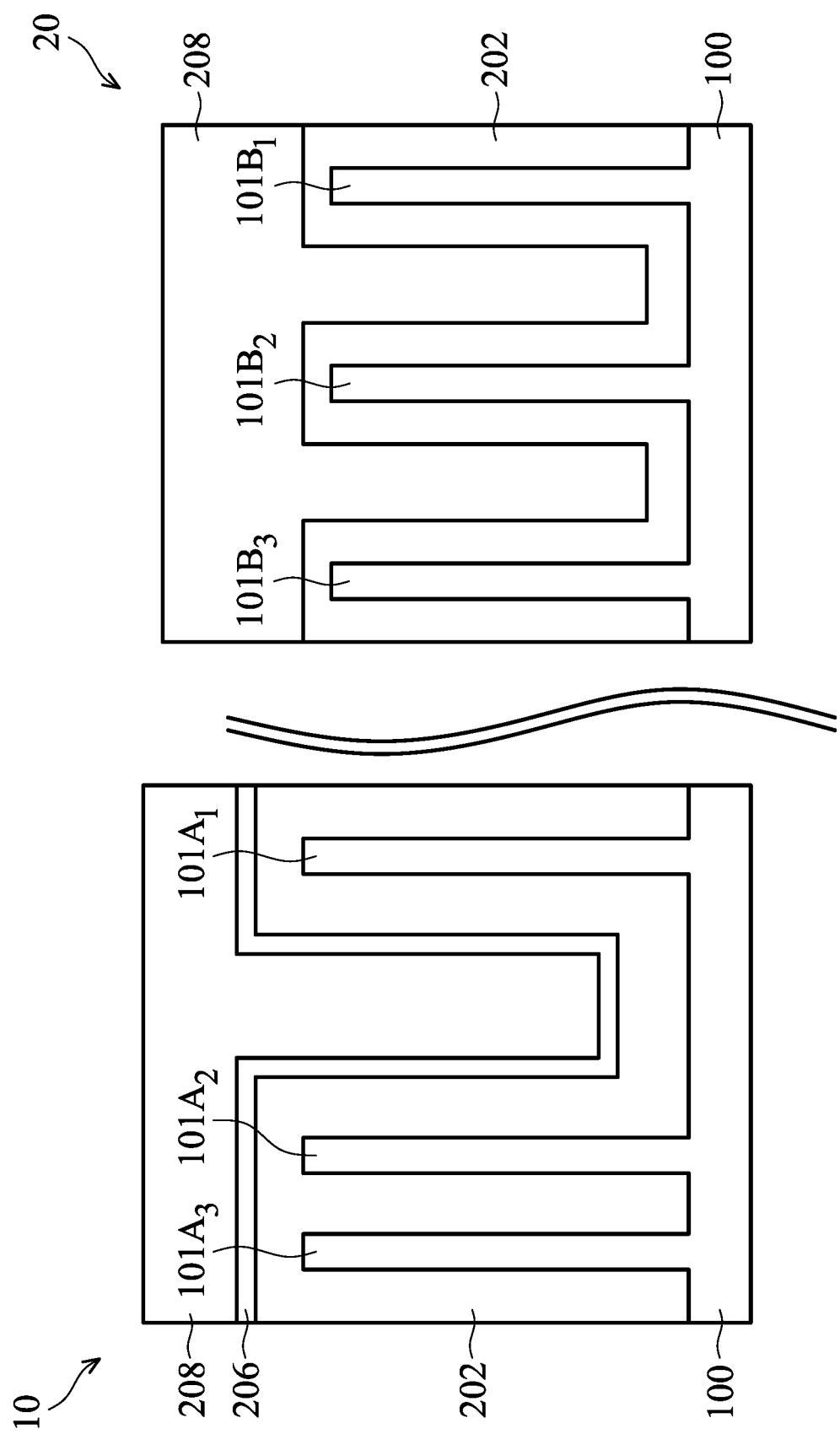

As shown in FIG. 2F, an insulating layer 208 is deposited over the spacer layers 206 and 202, in accordance with some embodiments. In some embodiments, the insulating layer 208 fills the recesses (or the trenches) between the fin structures, as shown in FIG. 2F. In some embodiments, the insulating layer 208 is made of a material that is different than the material of the spacer layer 206 or 102. The material and formation method of the insulating layer 208 may be the same as or similar to those of the insulating layer 108 shown in FIG. 1F.

Figure 2G:
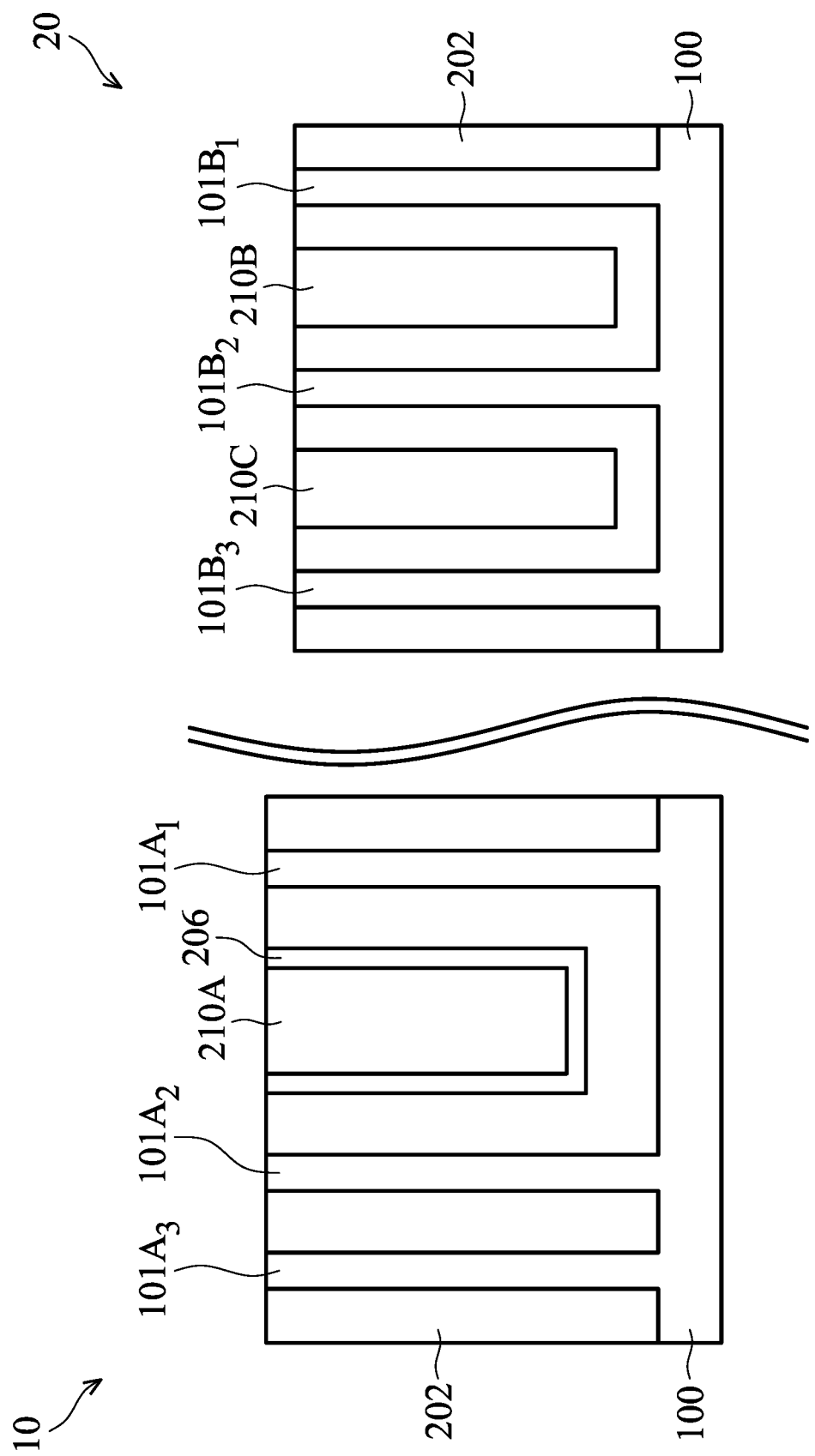

As shown in FIG. 2G, the insulating layer 208 is planarized to expose the fin structures $101A_1$-$101A_3$ and $101B_1$-$101B_3$, in accordance with some embodiments. A portion of the insulating layer 208 remaining in the recess (or the trench) between the fin structures $101A_1$ and $101A_2$ forms a blocking fin 210A. A portion of the insulating layer 208 remaining in the recess (or the trench) between the fin structures $101B_1$ and $101B_2$ forms a blocking fin 210B. A portion of the insulating layer 208 remaining in the recess (or the trench) between the fin structures $101B_2$ and $101B_3$ forms a blocking fin 210C.

Figure 2H:
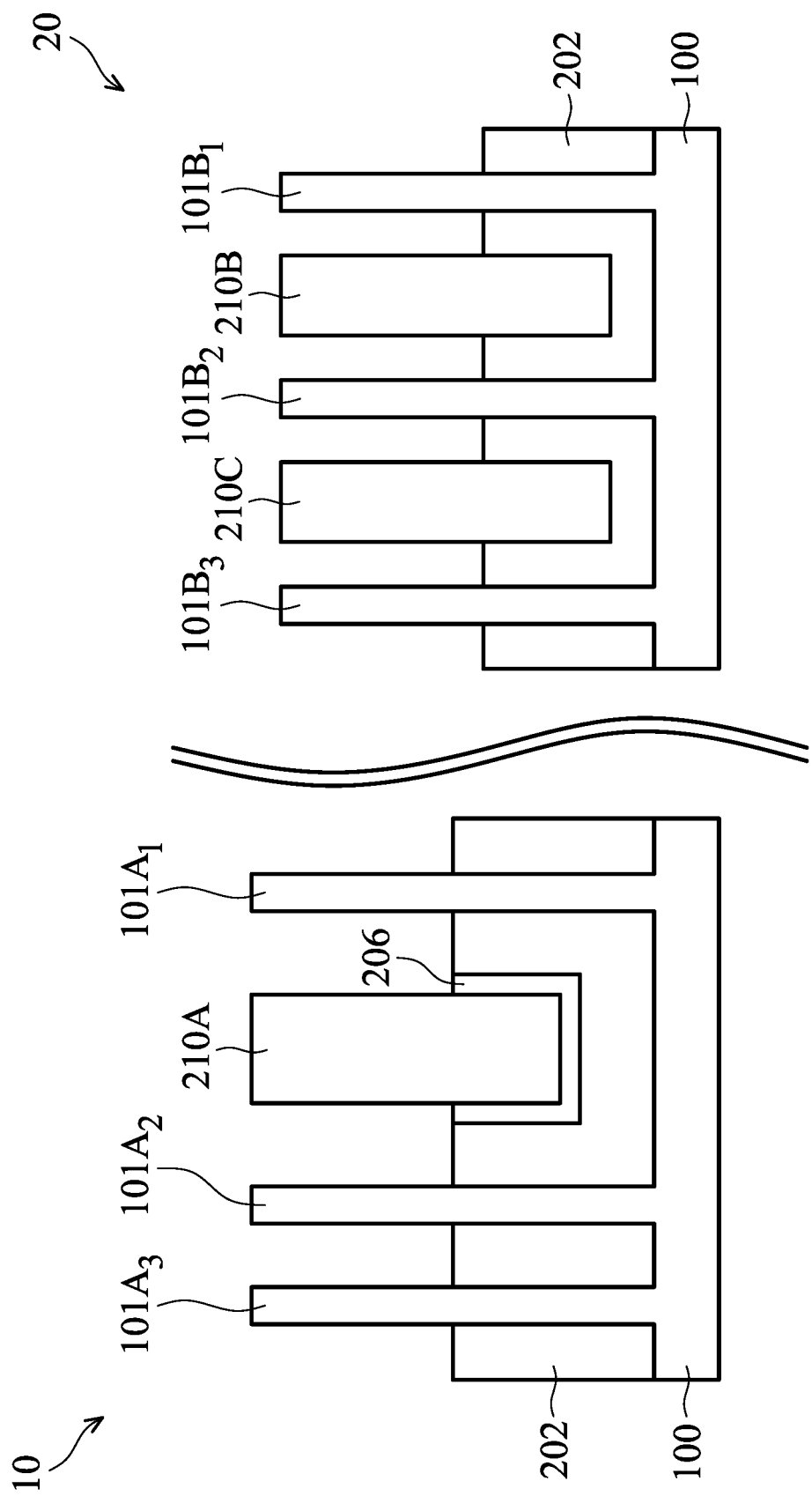

As shown in FIG. 2H, the spacer layers 202 and 206 are partially removed to expose upper portions of the fin structures $101A_1$-$101A_3$ and $101B_1$-$101B_3$, in accordance with some embodiments. In some embodiments, upper portions of the blocking fins 210A, 210B, and 210C are also exposed. In some embodiments, the spacer layers 202 and 206 are partially removed using an etching process. In some embodiments, since the material of the blocking fins 210A, 210B, and 210C is different than that of the spacer layers 202 and 206, the blocking fins 210A, 210B, and 210C are substantially prevented from being etched during the etching process.

Due to the additional spacer layer (i.e., the spacer layer 202), a wider space is provided between the fin structure ($101A_1$ or $101A_2$) and the blocking fin 210A, which facilitates the subsequent processes. In some embodiments, an IO device is designed to be formed over the region 10. The wider space allows the risk of I/O device breakdown to be significantly reduced. A greater breakdown voltage (VBD) of the I/O device may be obtained due to the wider space between the fin structure and the blocking fin. The wider space may ensure a subsequent gate replacement process to be well-performed. The residue issue may be prevented since a wider space is provided. The performance and reliability of the device formed over the region 10 are greatly improved.

Figure 2I:
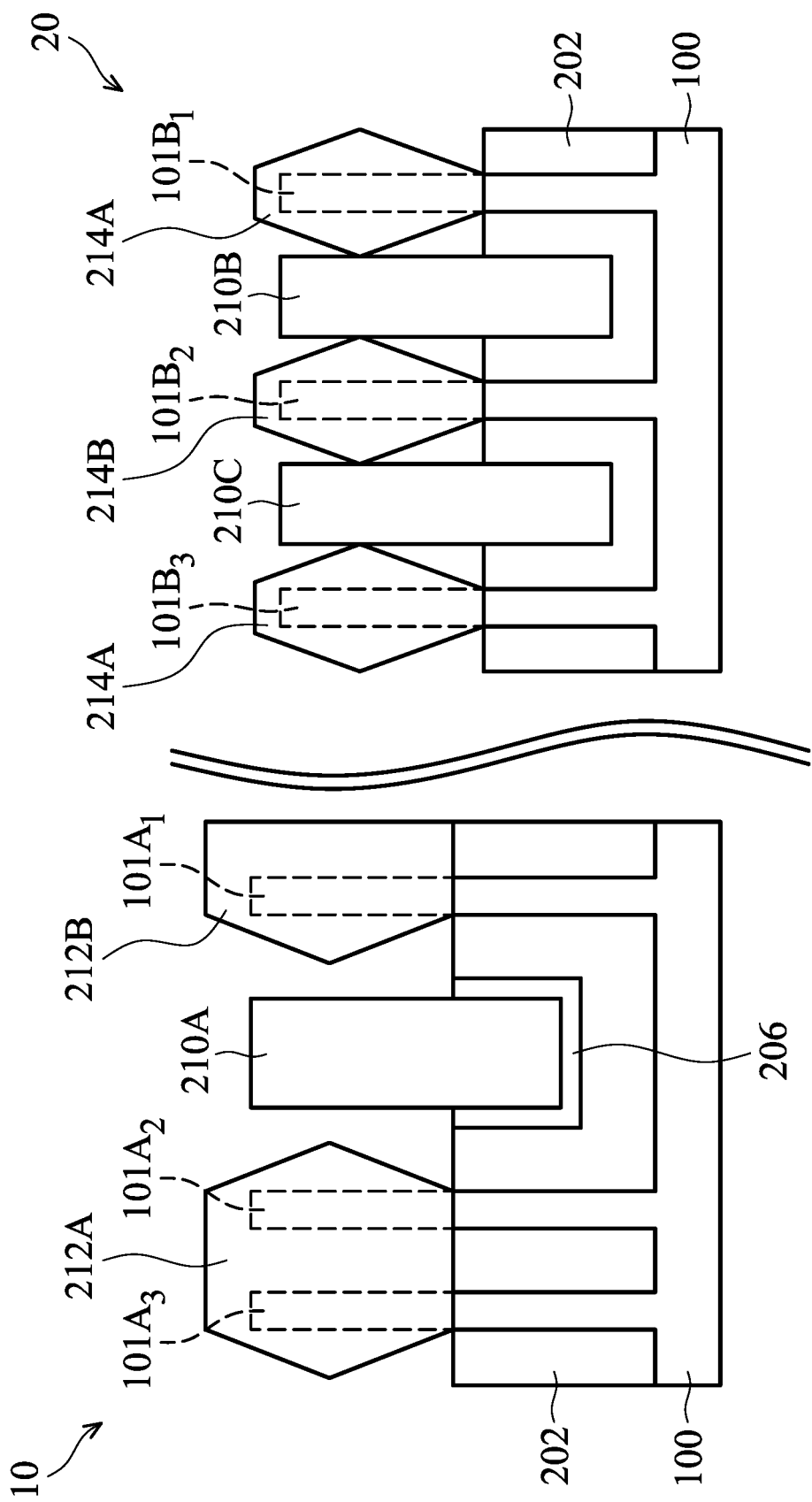

Afterwards, dummy gate stacks (not shown) are formed to wrap around portions of the fin structures $101A_1$-$101A_3$ and $101B_1$-$101B_3$. Afterwards, epitaxial structures 212A, 212B, 214A, and 214B are formed, as shown in FIG. 2I in accordance with some embodiments. In some embodiments, the epitaxial structures 212A, 212B, 214A, and 214B are formed to surround the fin structures $101A_1$-$101A_3$ and $101B_1$-$101B_3$. In some other embodiments, the portions of the fin structures $101A_1$-$101A_3$ and $101B_1$-$101B_3$ that are not covered by the dummy gate stacks are recessed before the formation of the epitaxial structures 212A, 212B, 214A, and 214B. In these cases, the epitaxial structures may be grown on the recessed fin structures.

The material and formation method of the epitaxial structures 212A and 212B may be the same as or similar to those of the epitaxial structures 112A and 112B shown in FIG. 1I. The material and formation method of the epitaxial structures 214A may be the same as or similar to those of the epitaxial structures 114A shown in FIG. 1I. The material and formation method of the epitaxial structure 214B may be the same as or similar to those of the epitaxial structure 114B shown in FIG. 1I.

The blocking fins 210A and 210B may be used to prevent the neighboring epitaxial structures 214A and 214B from being merged together. In some embodiments, the blocking fin 210A or 210B is in direct contact with one of or both of the epitaxial structures 214A and 214B.

Embodiments of the disclosure form a semiconductor device structure with multiple fin structures. Blocking fins are formed between the fin structures to prevent some neighboring epitaxial structures from being merged together. For some device regions (such as I/O device regions), an additional spacer layer is formed between the blocking fin and the fin structure. As a result, a distance between the blocking fin and the fin structure is enlarged, which facilitates subsequent processes, such as a gate replacement process. The performance and reliability of the semiconductor device structure are greatly improved. For example, the breakdown voltage of the I/O devices is significantly increased.

In accordance with some embodiments, a method for forming a semiconductor device structure is provided. The method includes forming a first fin structure, a second fin structure, a third fin structure, and a fourth fin structure over a substrate. The method also includes forming a first spacer layer over sidewalls of the first fin structure and the second fin structure. The method further includes forming a second spacer layer over the first spacer layer and sidewalls of the third fin structure and the fourth fin structure. In addition, the method includes forming a first blocking fin between the first fin structure and the second fin structure. The first blocking fin is separated from the first fin structure by portions of the first spacer layer and the second spacer layer. The method also includes forming a second blocking fin between the third fin structure and the fourth fin structure. The second blocking fin is separated from the third fin structure by a portion of the second spacer layer.

In accordance with some embodiments, a method for forming a semiconductor device structure is provided. The method includes forming a first fin structure, a second fin structure, a third fin structure, and a fourth fin structure over a substrate. The method also includes forming a first spacer layer over sidewalls of the first fin structure, the second fin structure, the third fin structure, and the fourth fin structure. The method further includes forming a second spacer layer over a portion of the first spacer layer that extends along the sidewalls of the first fin structure and the second fin structure. In addition, the method includes forming a first blocking fin between the first fin structure and the second fin structure. The first blocking fin is separated from the first fin structure by portions of the first spacer layer and the second spacer layer. The method also includes forming a second blocking fin between the third fin structure and the fourth fin structure. The second blocking fin is separated from the third fin structure by a portion of the first spacer layer.

In accordance with some embodiments, a semiconductor device structure is provided. The semiconductor device structure includes a first, a second, a third, and a fourth fin structures over a substrate. The semiconductor device structure also includes a first blocking fin between the first fin structure and the second fin structure. The semiconductor device structure further includes a second blocking fin between the third fin structure and the fourth fin structure. In addition, the semiconductor device structure includes a first spacer layer extending along sidewalls of the first, the second, the third, and the fourth fin structures. The semiconductor device structure also includes a second spacer layer extending along the sidewalls of the first fin structure and the second fin structure without extending along the sidewalls of the third fin structure and the fourth fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a first, a second, a third, and a fourth fin structures over a substrate;
   a first blocking fin between the first fin structure and the second fin structure;
   a second blocking fin between the third fin structure and the fourth fin structure;
   a first spacer layer extending along sidewalls of the first, the second, the third, and the fourth fin structures;
   a second spacer layer extending along the sidewalls of the first fin structure and the second fin structure without extending along the sidewalls of the third fin structure and the fourth fin structure;
   a fifth fin structure over the substrate, wherein the first fin structure is between the first blocking fin and the fifth fin structure; and
   a merged epitaxial structure over the first fin structure and the fifth fin structure.

2. The semiconductor device structure as claimed in claim 1, wherein a portion of the second spacer layer is between a portion of the first spacer layer and the first fin structure.

3. The semiconductor device structure as claimed in claim 1, wherein a portion of the first spacer layer is between a portion of the second spacer layer and the first fin structure.

4. The semiconductor device structure as claimed in claim 1, wherein the first spacer layer is thicker than the second spacer layer.

5. The semiconductor device structure as claimed in claim 1, wherein the first spacer layer and the second spacer layer are made of a same material.

6. The semiconductor device structure as claimed in claim 1, wherein the first blocking fin is separated from the first fin structure by a first distance, the second blocking fin is separated from the third fin structure by a second distance, and the first distance is greater than the second distance.

7. The semiconductor device structure as claimed in claim 1, further comprising:
   a first epitaxial structure over the third fin structure; and
   a second epitaxial structure over the fourth fin structure.

8. The semiconductor device structure as claimed in claim 7, wherein the first epitaxial structure is separated from the second epitaxial structure by the second blocking fin.

9. The semiconductor device structure as claimed in claim 8, wherein the first epitaxial structure and the second epitaxial structure are in direct contact with the second blocking fin.

10. The semiconductor device structure as claimed in claim 1, wherein the second blocking fin is made of an insulating material.

11. A semiconductor device structure, comprising:
    a first, a second, a third, and a fourth fin structures over a substrate;
    a first blocking fin between the first fin structure and the second fin structure, wherein the first blocking fin is separated from the first fin structure by a first distance;
    a second blocking fin between the third fin structure and the fourth fin structure, wherein the second blocking fin is separated from the third fin structure by a second distance, the first distance is greater than the second distance, and the first blocking fin is wider than the second blocking fin;
    a first epitaxial structure over the first fin structure; and
    a second epitaxial structure over the third fin structure, wherein the first epitaxial structure is wider than the second epitaxial structure.

12. The semiconductor device structure as claimed in claim 11, further comprising:
    a first spacer layer extending along sidewalls of the first, the second, the third, and the fourth fin structures; and
    a second spacer layer extending along the sidewalls of the first fin structure and the second fin structure.

13. The semiconductor device structure as claimed in claim 12, wherein the second spacer layer does not extend along the sidewalls of the third fin structure and the fourth fin structure.

14. The semiconductor device structure as claimed in claim 13, wherein the first spacer layer and the second spacer layer are made of a same material.

15. The semiconductor device structure as claimed in claim 11, wherein the second epitaxial structure is in direct contact with the second blocking fin.

16. A semiconductor device structure, comprising:
    a first fin structure and a second fin structure over a substrate;
    a first blocking fin beside the first fin structure;
    a second blocking fin beside the second fin structure;
    a first spacer layer extending along sidewalls of the first fin structure and the second fin structure;
    a second spacer layer extending along the sidewalls of the first fin structure without extending along the sidewalls of the second fin structure;
    a first epitaxial structure over the first fin structure; and
    a second epitaxial structure over the second fin structure, wherein the second epitaxial structure is in direct contact with the second blocking fin.

17. The semiconductor device structure as claimed in claim 16, wherein a portion of the second spacer layer is between a portion of the first spacer layer and the first fin structure.

18. The semiconductor device structure as claimed in claim 16, wherein the first blocking fin is separated from the first fin structure by a first distance, the second blocking fin is separated from the second fin structure by a second distance, and the first distance is greater than the second distance.

19. The semiconductor device structure as claimed in claim 16, wherein the first epitaxial structure is wider than the second epitaxial structure.

20. The semiconductor device structure as claimed in claim 16, wherein the first spacer layer is thicker than the second spacer layer.

* * * * *